United States Patent [19]

Bosch et al.

[11] Patent Number: 4,539,686
[45] Date of Patent: Sep. 3, 1985

[54] LASER DRIVING MEANS

[75] Inventors: Fridolin L. Bosch, Bethlehem; Clarence B. Swan, Allentown, both of Pa.

[73] Assignee: AT&T Bell Laboratories, Murray Hill, N.J.

[21] Appl. No.: 434,583

[22] Filed: Oct. 15, 1982

[51] Int. Cl.³ .............................................. H01S 3/10
[52] U.S. Cl. ........................................ 372/26; 372/38; 455/611; 455/618
[58] Field of Search ....................... 372/25, 26, 38, 44; 455/613, 611, 618; 332/7.51

[56] References Cited

U.S. PATENT DOCUMENTS 4,009,385  2/1977  Sell ....................................... 250/199
4,243,951  1/1981  Wolkstein et al. ...................... 372/26
4,339,822  7/1982  Kolodzey ................................ 372/26

OTHER PUBLICATIONS

Ostoich et al., "Direct Modulation of D. H. GaAlAs Lasers with GaAs M.E.S.F.E.T.s", Electronics Letters, vol. 11, No. 21, Oct. 16, 1975, pp. 515-516.

Primary Examiner—James W. Davis
Attorney, Agent, or Firm—Lester H. Birnbaum

[57] ABSTRACT

Disclosed is means for driving a laser whereby a dc bias current is supplied to keep the laser normally above threshold, and a modulation current brings the laser below threshold when a pulse appears. In one embodiment, a feedback controlled bias current source (11) and modulation current source (15) are coupled to the p-side terminal of the laser (10) while a constant voltage source (27) is coupled to the n-side terminal of the laser in a way which results in subtraction of the modulation current from the dc bias current. This mode of operation essentially eliminates laser overshoot and more nearly equalizes rise and fall times of the light pulses.

12 Claims, 4 Drawing Figures

LASER DRIVING MEANS

BACKGROUND OF THE INVENTION

This invention relates to laser transmitters and in particular to a means for driving the laser to produce optimum light pulses.

In standard laser transmitters used in lightwave communications, the laser is driven by a combination of dc bias current which is adjusted by some feedback control circuit and a modulation current based on the input data signal (see e.g., U.S. Pat. No. 4,009,385 issued to Sell). In the normal operation, the dc bias current keeps the laser just below its lasing threshold. The modulation current is added to the dc bias so that the laser is turned on when a pulse corresponding to the data input appears. Since the laser is normally off, power consumption is at a minimum. However, at high bit rates, problems exist in achieving well-shaped optical pulses with standard driving circuits. For example, when silicon bipolar transistors are switched on with subnanosecond rise times at high bit rates (i.e., typically 90 megabits/sec or higher), the current transmitted therethrough tends to overshoot the desired steady state value for the initial portion of the modulation pulse. This overshoot is reproduced in the resulting laser pulse. Further, there is an asymmetry in the current rise and fall times which is also reproduced in the laser pulses.

It is therefore a primary object of the invention to provide a means for driving the laser which produces optimum light pulses even at higher bit rates.

SUMMARY OF THE INVENTION

This and other objects of the invention are achieved in accordance with the invention, which in one aspect is a laser transmitter, including means for driving a laser in response to a data input signal and in another aspect is a method of operation. The driving means comprises means for supplying a dc bias current to the laser sufficient to raise the current through the laser above its threshold level, and means for supplying to the laser a modulation current corresponding to the data input. The currents are applied so that the modulation current is subtracted from the dc bias current and the appearance of a pulse in the modulation current lowers the current through the laser to below its threshold level.

BRIEF DESCRIPTION OF THE DRAWING

These and other features of the invention are delineated in detail in the following description. In the drawing.

It will be appreciated that for purposes of illustration, these figures are not necessarily drawn to scale.

DETAILED DESCRIPTION OF THE INVENTION

Figure 1:
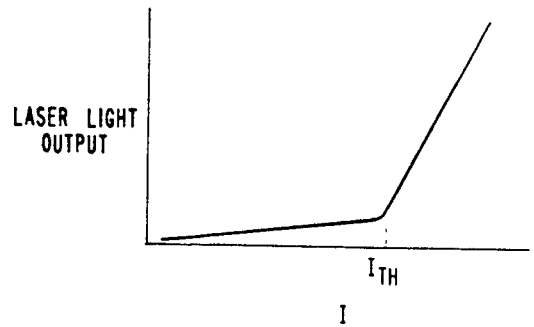
FIG. 1 is an illustration of a typical laser light output vs. current characteristic.

FIG. 1 illustrates a typical laser output characteristic. It will be noted that at currents below the laser threshold $I_{TH}$, light output is extremely small, and the laser is in its non-lasing OFF state. At currents above the threshold, a sharp increase in light output is observed, and the laser is turned ON. In prior art systems, a dc bias would keep the laser at a point just below threshold, and a modulation current which corresponded to the data signal would be superimposed on the dc bias. Thus, the laser would remain in its OFF state until a pulse corresponding to a "1" in the data signal was applied to bring the laser above threshold.

In accordance with the present invention, significant advantages were discovered to accrue from applying a dc bias above the lasing threshold. A modulation current is then subtracted from the dc bias current so that the laser is turned OFF whenever a pulse corresponding to a "1" appears. Otherwise, the laser remains ON.

Figure 2:
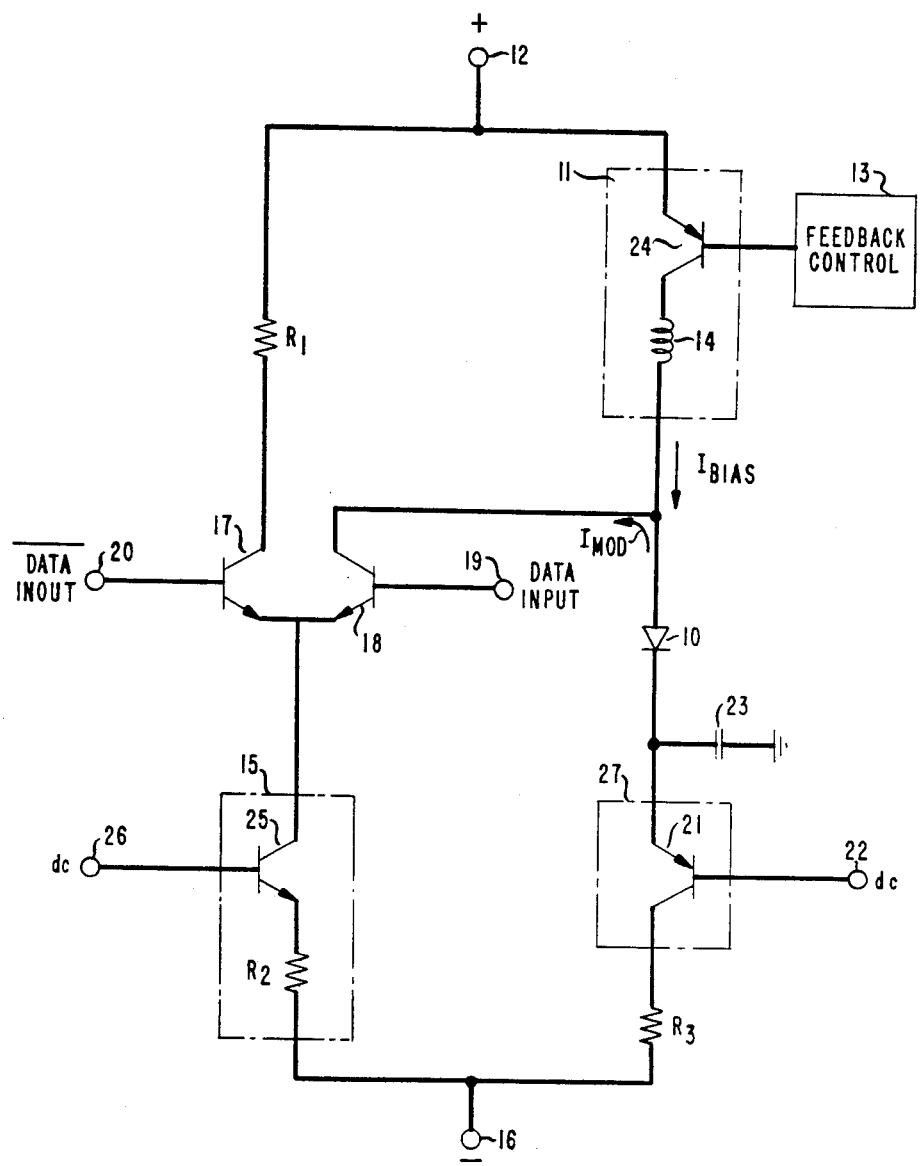
FIG. 2 is a schematic circuit diagram of a laser driving means in accordance with one embodiment of the invention.

A circuit for driving a laser in such a mode is illustrated in FIG. 2. The circuit was powered by a voltage between the positive terminal, 12, and the negative terminal, 16, supplied by a standard voltage regulator (not shown). In this example, the voltage was approximately 7 volts. The dc bias current, $I_{BIAS}$, was supplied to laser, 10, by the bias current source illustrated by box, 11. The source was coupled between the positive terminal, 12, and the positive terminal (p-side) of the laser. The bias current source can be any standard constant current source, and in this example was a p-n-p transistor, 24, with its collector coupled in series with an inductor, 14, having an inductance of approximately 30 μH. The magnitude of the bias current in this example was approximately 60 mA. The inductor is designed to exhibit high impedance only at high frequencies in order to prevent any loss of high frequency components of the modulation current instead for the laser. Thus, the coil minimizes distortion of the modulation current but can be omitted if transistor, 24, has a sufficiently high impedance.

The particular laser employed was a standard mesa-etched, buried heterostructure laser which indicated an n-type substrate of InP, an InGaAsP active region, and a p-type InGaAsP cap layer. The invention should be applicable to any semiconductor laser.

As known in the art, a feedback control circuit, 13, may be coupled to the bias current source to adjust the dc bias in order to compensate for changes in the threshold value during operation of the laser. The particular circuit employed here measures the light output from the back face of the laser and compares it with the data input. The difference between the average laser output and the average of data input over a selected period of time determines the amount of compensation. (For a detailed discussion of a standard feedback circuit, see U.S. Pat. No. 4,009,385 issued to Sell which is incorporated by reference herein.) The type of feedback circuit utilized is not believed to be critical to use of the present invention.

The modulation current, $I_{MOD}$, was provided by another constant current source, 15, which was coupled between the negative terminal, 16, and the emitters of n-p-n transistors, 17 and 18. Again, the current souce could be any standard means available in the art. In this example, an n-p-n transistor, 25, with its emitter coupled in series with a resistor, $R_2$ was utilized and provided a current of approximately 40 mA. This current was controlled by the dc potential applied at terminal 26 to the base of the transistor. In this example $R_2$ was 20 ohms and the potential was approximately 1.5 volts.

The collector of transistor, 18, was coupled to the p-side of the laser, and the collector of transistor, 17, was coupled through resistor $R_1$ to the positive terminal, 12. The data input pulse stream was supplied at terminal, 19, to the base of transistor, 18, while the complementary signal ($\overline{DATA}$) was supplied to terminal, 20, coupled to the base of the other transistor, 17.

The n-side of the laser was coupled to a constant voltage source indicated by box, 27. In this example, the constant voltage source comprised a p-n-p transistor, 21, with its emitter coupled to the laser, its base coupled to terminal, 22, and its collector coupled through resistor $R_3$ to negative terminal, 16. A dc reference voltage of approximately 2.5 volts was supplied to the base in this example to keep the n-side of the laser at a constant voltage of approximately 3.3 volts. Resistor $R_3$ was provided for convenience in monitoring the total dc current through the laser and can be omitted. In this example, $R_3$ was approximately 5 ohms. One electrode of a capacitor, 23, was also coupled to the n-side of the laser. The other electrode of the capacitor was grounded, as shown. The purpose of this element was to provide a shunt for rf components.

Figure 3:
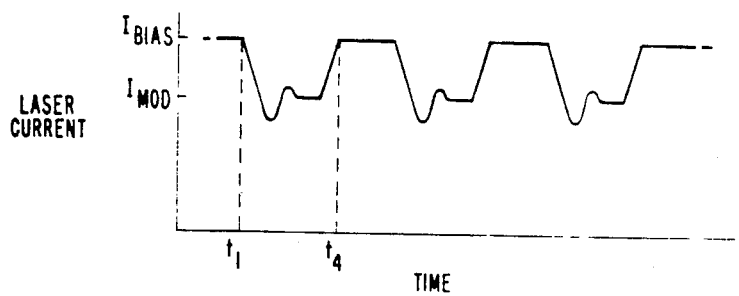
FIGS. 3 and 4 are approximate illustration of a stream of modulation current pulses and the corresponding light output pulses, respectively, in accordance with one embodiment of the invention.
Figure 4:
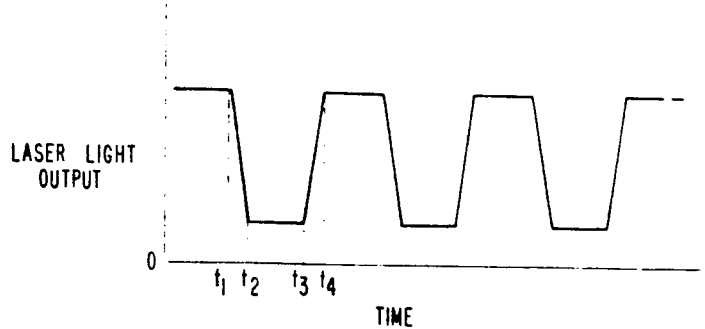

In operation, the bias current, $I_{BIAS}$, supplied to the p-side of the laser was sufficient in magnitude, in this example approximately 60 mA, to bring the laser above threshold and keep it in its ON state absent any signal from the modulation current source. In most applications, it is desirable to bias the laser at least 10 milliamps above threshold, and preferably 30–40 milliamps above threshold. With the data input applied, as long as only zeros appeared, the transistor, 18, remained non-conducting and so no modulation current was supplied to the laser, as shown in FIG. 3, up until time $t_1$. Rather, since the complementary signal was applied to transistor, 17, that transistor was made conducting as a result of the high potential applied to its base, and the modulation current was conducted from terminal, 12, through $R_1$ to terminal, 16. Whenever a "one" appeared in the data, as for example at $t_1$, the bias supplied to the base of transistor, 18, was sufficient to make transistor, 18, conducting and so current $I_{MOD}$ was drawn from the laser through the transistor, 18, to terminal, 16. The direction of current flow is such that the modulation current was subtracted from the bias current as shown in FIG. 3. Since the resulting current through the laser was below threshold, the laser was switched to its low output OFF state as shown in FIG. 4. Whenever the modulation pulse was removed, the laser returned to its ON state as for example at time $t_4$. (For purposes of illustration, a series of alternating ones and zeros is shown in FIGS. 3 and 4.)

As illustrated in FIG. 3, when the transistor, 18, was turned on at high speeds, the $I_{MOD}$ pulse had a tendency to initially overshoot its desired amplitude (typically by an amount of approximately 10 to 30 percent) and took some time (approximately 3 nsec) to settle to its steady state value. In typical prior art driving schemes, this overshoot would generally also appear in the resulting light pulse. However, as illustrated in FIG. 4, no significant distortion of the light pulse appears with the use of the present invention since the laser is turned to its low level OFF state when the modulation pulse is applied. It was discovered that the overshoot would not appear in the light pulses as long as the modulation pulse brought the current through the laser to a value below threshold, which in this example was 23 mA.

A further advantageous result of the present driving scheme is the fact that the light turn-off and turn-on times ($t_2 - t_1$ and $t_4 - t_3$) are essentially equal (i.e., a difference of no greater than 0.2 nsec). In a typical prior art scheme, the turn-on time is shorter than the turn-off time (i.e., a difference of typically 0.7 nsec). The difference between this invention and the prior art can be explained by the fact that modulation current turn-on tends to be faster than turn-off, and light build up of a laser from below threshold also tends to be faster than the rate of light decay. In the present scheme, the fast modulation current turn-on is associated with the slower laser turn-off, while the slower current turn-off is associated with the faster laser turn-on. Thus, the light pulses tend to be more symmetrical.

The invention should be advantageous in transmitters where the laser is operated at bit rates of 90 megabits/sec or higher. It is particularly advantageous at bit rates of 274 megabits/sec or higher. The invention may also be useful at bit rates below 90 megabits/sec where the modulation current amplitude level exhibits word pattern dependence or ripples.

It should be appreciated that the invention is equally advantageous if $\overline{DATA}$ input is supplied to terminal, 19, and DATA input applied to terminal, 20. This would produce light output pulses whenever there was a data input one and no light output whenever there was a data input zero. In such an example, the modulation current would still drive the laser from above threshold to below threshold whenever it is supplied, but the modulation current would be controlled by $\overline{DATA}$. It should therefore be understood that in the context of the application and in the claims, a "modulation current corresponding to the data input" can be a modulation current proportional to the data signal itself or to some function of the data signal such as $\overline{DATA}$.

One drawback of the present invention is the higher power consumption associated with keeping the laser generally ON. However, assuming a 50 percent duty cycle, this means only $\frac{1}{2}$ $I_{MOD}$ additional current required. In this example, with a 7 volt power source and $I_{MOD}=40$ milliamp, this translates into approximately 140 milliwatts of additional power consumption which is considered to be inconsequential in relation to total power consumption (approximately 800 mW).

It should be appreciated that the use of terminals as shown in FIG. 2 is intended to be primarily schematic since the circuit of the invention will in most instances be part of an integrated circuit. The terminals therefore indicate electrical connections to other parts of the circuit which provide the appropriate potentials to the portions of the present circuit so identified.

It will also be appreciated that by reversing all polarities shown in FIG. 2, the modulation current source and bias current source can also be coupled to the n-side of the laser. The important criterion is that $I_{BIAS}$ and $I_{MOD}$ have different directions through the laser so that the latter is subtracted from the former.

It should also be noted that standard FETs could be substituted for the bipolar transistors utilized in the current and voltage sources described. Also, additional feedback circuitry could be provided to control $I_{MOD}$ as well as $I_{BIAS}$ if desired. Further, use of the term "circuit means" in the claims is intended to be broad enough to not require any power source.

Various additional modifications will become apparent to those skilled in the art. All such variations which basically rely on the teachings through which the invention has advanced the art are properly considered within the spirit and scope of the invention.

What is claimed is:

1. A laser transmitter comprising a laser and circuit means for driving said laser in response to a data input signal, said circuit means comprising:
   circuit means including a constant current source for supplying a dc bias current to said laser sufficient to raise the current through said laser above its lasing threshold level; and
   circuit means including a constant current source for supplying to said laser a modulation current corresponding to said data input so that said modulation current is subtracted from said dc bias current and the appearance of a pulse in said modulation current lowers the current through said laser to below its lasing threshold level.

2. The circuit according to claim 1 wherein said dc bias constant current source comprises a transistor and an inductor in series.

3. The circuit according to claim 1 wherein said dc bias current means further comprises feedback control circuitry for adjusting the level of current during operation of the laser.

4. The circuit according to claim 1 wherein said modulation current means comprises a constant current source coupled in common to the emitters of a pair of bipolar transistors, with the collector of one of the transistors being coupled to said laser, and the base of one of the transistors being adapted to receive the data signals while the base of the other transistor is adapted to receive the complement of said data signals.

5. The circuit according to claim 1 wherein a constant voltage source is coupled to the opposite side of said laser from the dc bias current means and modulation current means.

6. The circuit according to claim 5, wherein said constant voltage source comprises a transistor, and the transistor is coupled in series with a resistor.

7. The circuit according to claim 1 further comprising a capacitor coupled to the side of the laser opposite said dc bias current means and said modulation current means in order to shunt rf components of current therethrough.

8. The circuit according to claim 1 wherein said modulation current means is capable of operating at a bit rate of at least 90 megabits/sec.

9. A method of operating a laser to produce optical pulses in response to a data input signal comprising the steps of:
   applying to said laser a dc bias current having a value exceeding the lasing threshold of the laser; and
   applying to said laser a modulation current corresponding to said data input so that said modulation current is subtracted from said bias current and the resulting current through the laser is below the threshold level whenever a pulse appears in said modulation current.

10. The method according to claim 9 wherein the laser is operated at a bit rate of at least 90 megabits/sec.

11. The method according to claim 9 wherein the leading edge of said modulation current pulses exceeds the steady state amplitude of the pulses, but the optical output pulses are essentially free from any variation in steady state amplitude.

12. The method according to claim 9 wherein the rise and fall times of the optical output pulses are essentially equal.

* * * * *